United States Patent [19]

Eisele et al.

[11] 4,254,590
[45] Mar. 10, 1981

[54] METHOD FOR THE PRODUCTION OF A DISK-SHAPED SILICON SEMICONDUCTOR COMPONENT WITH NEGATIVE BEVELING

[75] Inventors: Dieter Eisele, Lampertheim; Jürgen Pape; Armin Hochhut, both of Bürstadt, all of Fed. Rep. of Germany

[73] Assignee: BBC Brown Boveri & Company Limited, Baden, Switzerland

[21] Appl. No.: 73,791

[22] Filed: Sep. 10, 1979

[30] Foreign Application Priority Data

Nov. 13, 1978 [DE] Fed. Rep. of Germany ....... 2849184

[51] Int. Cl.³ ............................................. B24B 1/00
[52] U.S. Cl. ....................................... 51/324; 51/235
[58] Field of Search .................... 51/235, 324, 283 R, 51/283 E; 269/21

[56] References Cited

U.S. PATENT DOCUMENTS

| | | | |
|---|---|---|---|
| 2,241,478 | 5/1941 | Remington | 51/324 |
| 2,709,324 | 5/1955 | Hull | 51/324 X |
| 3,685,216 | 8/1972 | Frey | 51/324 |
| 3,693,301 | 9/1972 | Lemmitre | 51/324 |
| 3,833,230 | 9/1974 | Noll | 51/235 |
| 3,861,089 | 1/1975 | England | 51/324 |
| 3,889,431 | 6/1975 | Johnson | 51/324 |

FOREIGN PATENT DOCUMENTS 1212215 3/1966 Fed. Rep. of Germany .
1281584 10/1968 Fed. Rep. of Germany .
1904798 4/1970 Fed. Rep. of Germany .

OTHER PUBLICATIONS

IEEE Transactions on Electronic Devices, vol. ED-20, No. 4, April 1973, pp. 347–352.

Primary Examiner—Harold D. Whitehead
Attorney, Agent, or Firm—Oblon, Fisher, Spivak, McClelland & Maier

[57] ABSTRACT

A method for the production of a disk-shaped silicon semiconductor component with at least two adjoining zones of opposite type conductivity and different doping strengths using a lapping disk which includes the steps of positioning and semi-conductor component adjacent the lapping disk, subjecting the semiconductor disk to a suction pressure on its side opposite the lapping disk so as to be bowed up from an initial lapping plane with a radius of curvature corresponding to a desired angle, lapping the semiconductor disk with the rotating lapping disk and beveling off the bounding surface of the semiconductor disk opposite the plane of a pn-junction separating the two zones.

3 Claims, 1 Drawing Figure

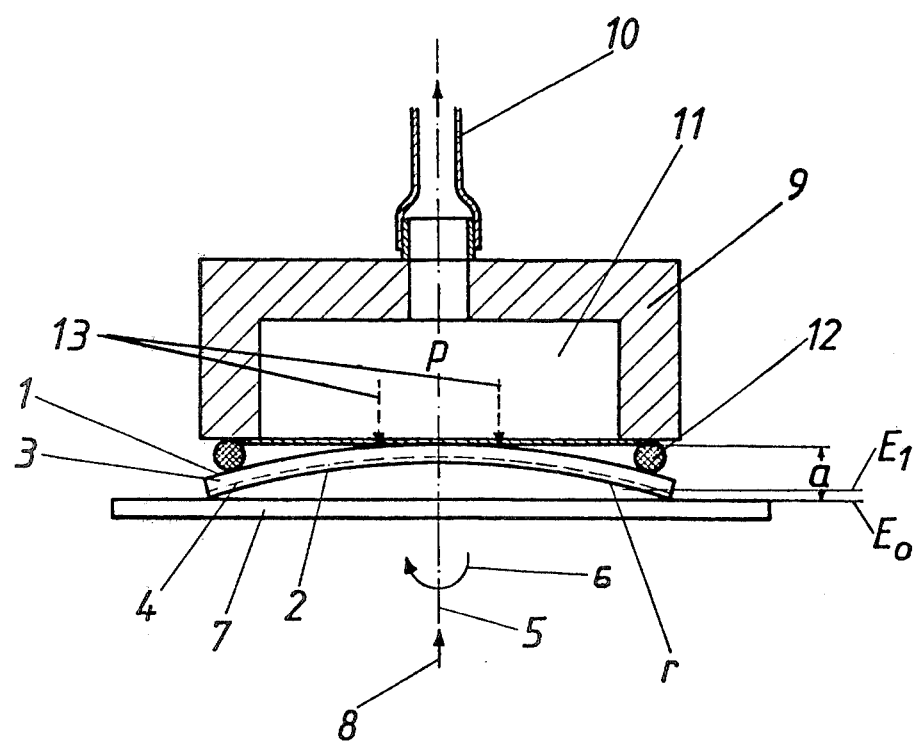

METHOD FOR THE PRODUCTION OF A DISK-SHAPED SILICON SEMICONDUCTOR COMPONENT WITH NEGATIVE BEVELING

BACKGROUND OF THE INVENTION

1. Field of the Invention

The invention relates to a method for the production of a disk-shaped silicon semiconductor component with at least two adjoining zones of opposite type conductivity and different doping strengths where the bounding surface of the semiconductor disk opposite the plane of the pn-junction separating the two zones is beveled with a rotating lapping disk at a shallow angle oriented so that the cross section of the semiconductor disk is smaller on the highly doped side than on the side with lower doping (negative beveling).

2. Description of the Prior Art

In a known method the beveled surface is produced in a grinding or lapping process using a steel block in the upper surface of which is provided a spherical depression, the radius of curvature of which corresponds to a first bevel angle to be generated (DE-PS 1 212 215). A grinding paste is distributed over the surface of the depression. The silicon disk is laid in the depression, the circumference of one of the main surfaces of the disk then being in contact with the surface of the depression.

In the known case the silicon disk is rotated, but of course the relative rotary motion can also be produced by rotation of the grinding or lapping disk. To produce a very shallow angle, several steel blocks with spherical depressions of increasing radii of curvature must be used in succession. This method consequently requires costly equipment.

The aim of the negative beveling is to lower the maximum field strengths at the surface of the semiconductor component. In DE-AS 1 281 584 an optimal negative angle of 6° is mentioned. It is known, however, that for reduction of the surface field strengths still shallower angles are desirable (IEEE Transactions on Electron Devices vol. ED-20, no. 4, April 1973, pp. 347–352). In this reference it is further shown that the absolute field-strength maximum actually develops somewhat below the bounding surface of the silicon disk and that rather small bevel angles always cause reduction in the maximum field strength, and indeed the more so, the flatter the doping profile and the higher the n-base doping. It is assumed here that an n-doped silicon disk is involved.

The realization of a very shallow bevel is limited to the extent that the effective current-carrying cross section is decreased by it. For circumventing this problem it is known how, by an alternation of diffusion and mechanical etching processes, to create in the edge region of the silicon disk a pn-junction extending at least approximately along an obtuse conical surface, the bounding surface of the silicon semiconductor disk likewise being made obtusely conical (DE-OS No. 1 904 798). Such an alternation of different fabrication steps can be undesirable from the technical viewpoint of manufacture.

The starting point here, therefore, is the initially discussed known method for the production of a disk-shaped semiconductor component, in which the beveling is done only in the region of the pn-junction emerging at the bounding surface.

SUMMARY OF THE INVENTION

The object for the invention is to simplify the grinding or lapping process and still achieve very shallow angles, i.e. 5° and considerably less.

The invention solves this problem by applying suction to the side of the semiconductor disk away from the lapping disk and bowing it up from the lapping surface with a radius of curvature corresponding to the desired bevel angle.

The semiconductor disk is bowed up from the lapping surface in such a manner that its edge is still in contact with the latter and by rotation of the latter, silicon material can be worn away up to somewhat above the point of emergence of the pn-junction at the bounding surface. It is convenient here, that with the same suction, thick silicon disks, for which shallower angles are necessary, are not so strongly bowed as thin silicon disks, for which, on the other hand, larger angles are required.

The angle value can be adjusted by varying the suction, or, with constant suction, a stop is placed at the appropriate distance from the initial lapping plane. The latter approach is preferable because it leads to more precise maintenance of the desired angle value.

BRIEF DESCRIPTION OF THE DRAWING

Various other objects, features and attendant advantages of the present invention will be more fully appreciated as the same becomes better understood from the accompanying drawing wherein:

The Sole FIGURE shows the preferred embodiment of the present invention.

DETAILED DESCRIPTION OF THE PREFERRED EMBODIMENT

A silicon disk 1 is shown with a lower p-doped zone 2 and an upper n-doped zone 3. Between these zones 2 and 3 there is indicated by a dashed line a pn-junction 4. This pn-junction 4 lies nearer the bottom surface of the silicon disk than the upper surface. Otherwise too much material would have to be removed to achieve a very shallow angle.

The silicon disk 1 rests with its lower edge on a lapping disk 7 rotating about the geometric axis 5 as indicated by arrow 6. The drawing shows the start of the grinding process, when the lower edge of the silicon disk 1 is located in the initial lapping plane $E_o$. To achieve beveling of the silicon disk 1 along the plane $E_1$ relative motion between the silicon disk 1 and the lapping disk 7 along the axis 5 is necessary. Preferably, the silicon disk 1 is moved downward.

For production of a suction pressure P a vacuum bell 9 with a hose connection 10 to a vacuum pump (not shown) is provided. The interior 11 of the vacuum bell 9 is sealed against the upper surface of the silicon disk 1 by an O-ring 12 on the bottom rim of the bell. The outside diameter of the O-ring 12 is about the same as the diameter of the silicon disk 1, i.e. the O-ring seats near the edge of the silicon disk 1. The vacuum bell 9 is able to travel in the direction of the axis 5. The dashed arrows 13 indicate a stop which can be provided, e.g., an adjustable annulus fastened to the vacuum bell 9 above the silicon disk 1. The distance of the stop 13 above the initial lapping plane $E_o$ is deonted by a, the radius of curvature of the silicon disk, shown exaggeratedly bowed, by r.

In carrying out the lapping operation, the silicon disk 1 is laid on the lapping disk 7. Then the vacuum bell 9 with the O-ring 12, which may be situated in a groove in the bell's bottom rim, is set on the silicon disk 1 symmetrically about the central axis normal to the silicon disk 1. With the vacuum pump there is developed a suction pressure P which bows the silicon disk upwards, as shown, until it strikes the stop 13. The lapping disk 7 is then driven in rotation, and the vacuum bell 9 moved downward, until a section $E_1$ is reached which passes through the pn-junction 4 at the bounding surface of the silicon disk 1. Thus, the downward travel of the vacuum bell 9 through a distance equal to that between the planes $E_o$ and $E_1$ determines the portion of the bounding surface of the silicon disk 1 affected by the beveling.

By this method, angles between 10' and 5° are obtainable, an angle of 0.9° being preferred.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for the production of a disk-shaped silicon semi-conductor component with at least two adjoining zones of opposite type conductivity and different doping strengths using a lapping disk which comprises:
   positioning the semiconductor disk adjacent the lapping disk;
   subjecting the semiconductor disk to a suction pressure on its side opposite the lapping disk so as to be bowed up from an initial lapping plane with a radius of curvature corresponding to a desired angle;
   rotating said lapping disk;
   lapping said semiconductor disk with said rotating lapping disk at a shallow angle of orientation such that the cross section of the semiconductor disk is smaller on the more highly doped side than on the side with lower doping; and
   beveling off the bounding surface of the semiconductor disk opposite the plane of the junction separating the two zones into the region of the junction separating the two zones.

2. A method as set forth in claim 1, which further comprises:
   varying the suction pressure so as to adjust the value of said angle.

3. A method as set forth in claim 1 wherein a stop member is disposed a predetermined distance from said initial lapping plane and which further comprises:
   adjusting the angle value at a constant suction pressure by adjusting the distance of said stop member from said initial lapping plane.

* * * * *